United States Patent
Chang

(10) Patent No.: US 7,098,096 B2
(45) Date of Patent: Aug. 29, 2006

(54) METHOD OF FABRICATING MULTI-BIT FLASH MEMORY

(75) Inventor: Kent Kuohua Chang, Taipei (TW)

(73) Assignee: MACRONIX International Co., Ltd., Hsinchu (TW)

( * ) Notice: Subject to any disclaimer, the term of this patent is extended or adjusted under 35 U.S.C. 154(b) by 40 days.

(21) Appl. No.: 10/707,874

(22) Filed: Jan. 20, 2004

(65) Prior Publication Data

US 2004/0137683 A1 Jul. 15, 2004

Related U.S. Application Data

(62) Division of application No. 10/248,374, filed on Jan. 15, 2003, now Pat. No. 6,720,613.

(51) Int. Cl.
*H01L 21/8238* (2006.01)
(52) U.S. Cl. .................. 438/201; 438/211; 257/315; 257/E29.309
(58) Field of Classification Search ............. 438/211, 438/201, 257, 593; 257/239, 315, E29.308
See application file for complete search history.

(56) References Cited

U.S. PATENT DOCUMENTS

| | | | |
|---|---|---|---|
| 6,420,237 B1 * | 7/2002 | Chang | 438/300 |
| 6,432,782 B1 * | 8/2002 | Lung et al. | 438/300 |
| 6,620,683 B1 * | 9/2003 | Lin et al. | 438/257 |
| 6,674,133 B1 * | 1/2004 | Chang | 257/391 |
| 6,747,896 B1 * | 6/2004 | Wong | 365/185.18 |
| 6,826,084 B1 * | 11/2004 | Wong | 365/185.18 |
| 2002/0149066 A1 * | 10/2002 | Chang et al. | 257/391 |
| 2003/0193064 A1 * | 10/2003 | Wu | 257/315 |

\* cited by examiner

*Primary Examiner*—Fernando L. Toledo
(74) *Attorney, Agent, or Firm*—Jianq Chyun IP Office

(57) ABSTRACT

A method of fabricating a multi-bit flash memory, having a control gate, a floating gate, a source region, a drain region and a channel region. An isolation region is formed in the floating gate to partition the floating gate into a plurality of conductive blocks. The conductive blocks are arranged in an array with rows extending from the source region to the drain region. Each row of the array has two conductive blocks. Before any data is written to the flash memory, the channel regions under the conductive blocks of the same row have the same threshold voltage, while the channel regions under the conductive blocks of different rows have different threshold voltage.

12 Claims, 8 Drawing Sheets

METHOD OF FABRICATING MULTI-BIT FLASH MEMORY

CROSS REFERENCE TO RELATED APPLICATIONS

This application is a divisional of a prior application Ser. No. 10/248,374, filed Jan. 15, 2003, now U.S. Pat. No. 6,720,613.

BACKGROUND OF INVENTION

1. Field of the Invention

The invention relates in general to a non-volatile memory, and more particularly, to a multi-bit flash memory and method of fabricating the same.

2. Related Art of the Invention

Among various non-volatile memories, the flash memory has become a memory device broadly applied in personal computer and electronic equipment due to the advantages of multiple data accesses and data retention after power interrupt.

The typical flash memory includes floating gate and control gate made of doped polysilicon. The floating gate is formed between the control gate and the substrate and under a floating state without electric connection to any other devices. The control gate is coupled to the word line. The flash memory further includes a tunneling oxide and a dielectric layer located between the substrate and the floating gate, and between the floating gate and the control gate, respectively. While programming the flash memory, a positive voltage is applied to the control gate, and a relatively small voltage is applied to the drain region (or source region). Thereby, hot electrons generated between the substrate and the drain region (or source region) are injected through the tunneling oxide and trapped in the floating gate. The hot electrons are uniformly distributed all over the polysilicon floating gate. Therefore, one flash memory cell can store either "1" or "0" and is a single-bit memory cell.

The increase of semiconductor integration has driven the demand for developing multi-bit memory cells. For example, in the U.S. Pat. No. 6,420,237, a method of fabricating a flash memory with multi-bit memory cells is disclosed. In this disclosure, a floating gate is partitioned into two independent blocks to form the two-bit structure. Again, the multi-bit memory cell cannot meet the high-density data storage requirement, and the memory cell able to store multiple bits is required.

SUMMARY OF INVENTION

The present invention provides a multi-bit flash memory and a method of fabricating the same. Multiple bits of data can be stored in a single memory cell of the flash memory, such that the device integration is increased.

The present invention further provides a multi-bit flash memory and a method of fabricating the same to avoid over-erase and enhance reliability of the flash memory.

The flash memory provided by the present invention comprises a control gate on a substrate, a floating gate between the control gate and the substrate, a source region and a drain region in the substrate at two sides of the floating gate, a channel region in the substrate under the floating gate, and an isolation region in the floating gate. The isolation region partitions the floating gate into a plurality of conductive blocks arranged as an array. The rows of the array extend from the source region to the drain region. Each row of the array comprises two conductive blocks, and each column of the array comprises n (n is a positive integer) conductive blocks. Before data is written into the multi-bit flash memory, the channel regions under the conductive blocks of the same row have the same threshold voltage, while the channel regions under the conductive blocks of different rows have different threshold voltages.

The above multi-bit flash memory further comprises a gate dielectric layer formed between the control gate and the floating gate, and a tunneling oxide layer formed between the floating gate and the substrate.

In the above structure, the isolation region partitions the floating gate into a plurality of conductive blocks to form the multi-bit structure, and the channel regions under the conductive blocks of different rows have different threshold voltages. Therefore, multiple bits of data can be saved in a single memory cell to increase the device data storage quantity and integration. Further, as the floating gates are partitioned into individual and independent conductive blocks (that is, the bits are separated from each other), the problem of secondary electron injection is resolved, and the device reliability is enhanced.

The method of fabricating a multi-bit flash memory provided by the present invention comprises the following steps. A silicon oxide layer and a conductive layer are sequentially formed on a substrate. An isolation layer is formed in the conductive layer to partition the conductive layer into a plurality of conductive blocks. An array formed of the conductive blocks includes rows extending from one bit line to another bit line, and columns each having n (n is a positive integer) conductive blocks. A gate dielectric layer is formed on the conductive layer. The gate dielectric layer and the conductive layer are patterned to form a floating gate. Bit lines are formed in the substrate at two sides of the floating gate. A control gate is then formed on the gate dielectric layer. A threshold voltage adjustment step is then performed to result in different threshold voltages for the channel regions under the conductive blocks of different rows.

In the above method, the conductive layer includes germanium polycide. The method of forming the isolation region includes forming a patterned photoresist layer exposing the region predetermined for forming the conductive blocks on the conductive layer, following by an ion implantation step for implanting oxygen ions (or nitrogen ion) into the exposed region. An annealing step is then performed, such that the oxygen ions (or nitrogen ion) are reacted with the silicon of the conductive layer.

The above method further comprises a step of forming a field oxide layer on the bit lines and a spacer on a sidewall of the floating gate.

Further, in the above method, the isolation region partitions the conductive layer into a plurality of conductive blocks. The channel regions under the conductive blocks of different rows have different threshold voltages, such that a single memory cell has the multi-bit structure. Therefore, without increasing the volume of the memory cell, the stored bits of data and device integration are increased. Further, as the conductive blocks are separate from each other (that is, each bit of the memory cell are independent from each other), the problem of generating secondary electron injection is resolved.

BRIEF DESCRIPTION OF DRAWINGS

These, as well as other features of the present invention, will become more apparent upon reference to the drawings.

DETAILED DESCRIPTION

Figure 1A:
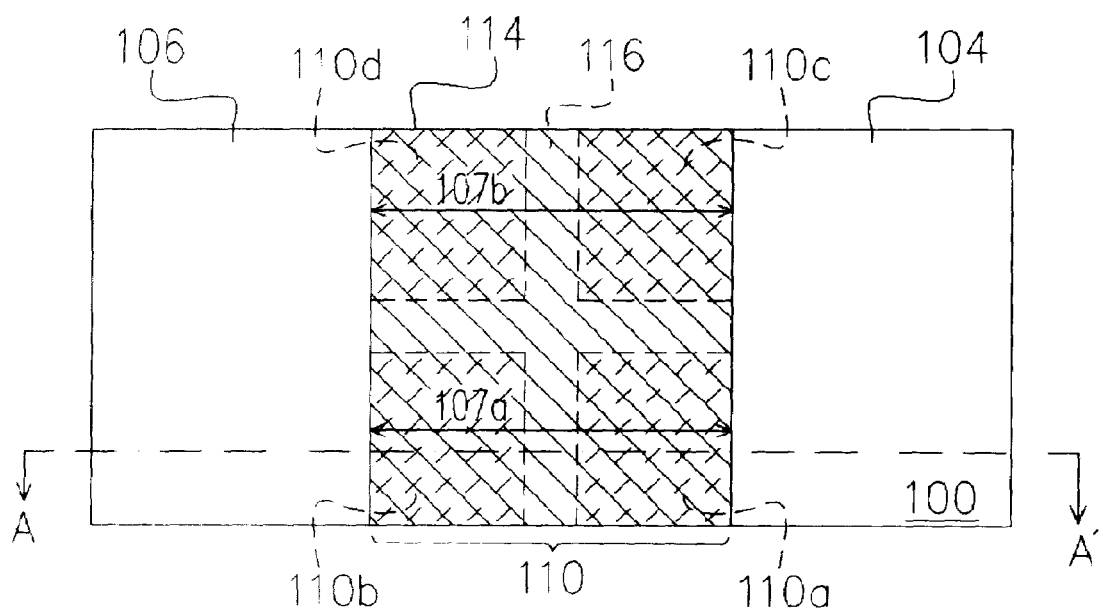
FIG. 1A shows a top view of a multi-bit flash memory in one embodiment of the present invention.
Figure 1B:
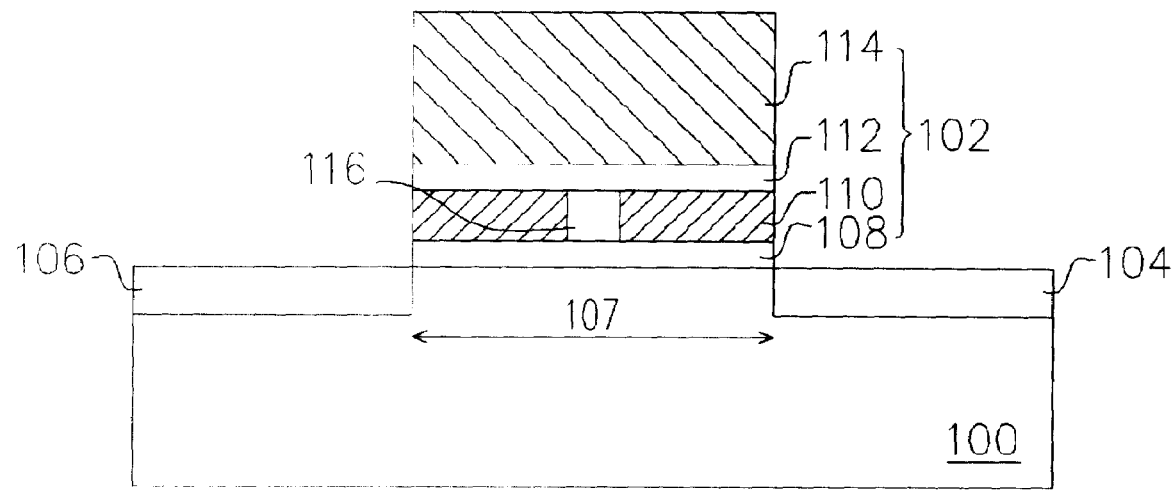
FIG. 1B shows a cross-sectional view along A–A' of FIG. 1A.
Figure 2:
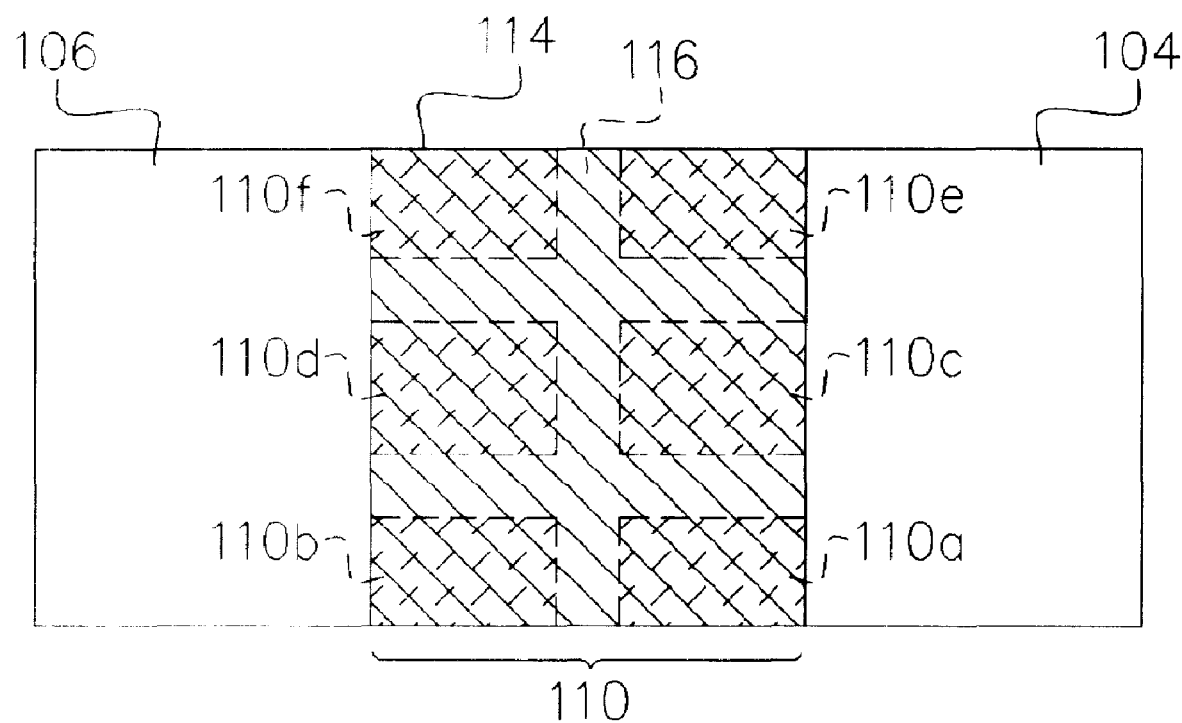
FIG. 2 shows a top view of a multi-bit flash memory in another embodiment of the present invention.

The structure of the multi-bit flash memory is described with reference to the accompanied drawings. FIG. 1A (top view) and FIG. 1B (cross-sectional view) illustrate the structure of a multi-bit flash memory in one embodiment of the present invention. FIG. 2 shows the top view of a multi-bit flash memory in another embodiment of the present invention. In FIG. 2, FIGS. 1A and 1B, the same devices are denoted by the same reference numerals.

Referring to FIGS. 1A and 1B, the flash memory comprises a substrate 100, a gate structure 102, a source region 104, a drain region 106 and a channel region 107. The gate structure 102 is located on the substrate 100. The source region 104 and drain region 106 are formed in the substrate 100 at two sides of the gate structure 102. The channel region 107 is located in the substrate 100 under the gate structure 102 between the source region 104 and the drain region 106.

The gate structure 102 includes a tunneling oxide layer 108, a floating gate 110, a gate dielectric layer 112 and a control gate 114. The control gate 114 is located on the substrate 100. The floating gate 110 is formed between the control gate 114 and the substrate 100. The gate dielectric layer 112 is formed between the control gate 114 and the floating gate 110. The material of the gate dielectric layer 112 includes silicon oxide, silicon oxide/silicon nitride, or silicon oxide/silicon nitride/silicon oxide (ONO), for example. The tunneling oxide layer 108 is formed between the floating gate 110 and the substrate 100. An isolation region 116 is formed in the floating gate 110 to partition the floating gate 110 into a plurality of conductive blocks for forming the multi-bit structure. The conductive blocks are arranged as an array with rows extending from the source region 104 to the drain region 106. In the array of conductive blocks, each row comprises two conductive blocks and each column comprises n (n is a positive integer) conductive blocks. Before data is written into the multi-bit flash memory, the channel regions under the conductive blocks of the same row have the same threshold voltage, while the channel regions under the conductive blocks of different rows have different threshold voltages. In this embodiment, a 2×2 array with four conductive blocks (110a, 110b, 110c and 110d) are exemplarily described. Therefore, under the status without any data written in the flash memory, the channel regions under the conductive blocks 110a and 110b of the first row have the same threshold voltage. Similarly, the channel regions under the conductive blocks 110c and 110d of the second row have the same threshold voltage. However, the channel regions under the conductive blocks 110a and 110b have a threshold voltage different from that of the channel regions under the conductive blocks 110c and 110d.

In the above structure, the isolation region 116 partitions four conductive blocks 110a, 110b, 110c and 110d, while the channel regions under the conductive blocks 110a and 110b have different threshold voltage from the channel regions under the conductive blocks 110c and 110d. Therefore, four bits of data can be saved in a single memory cell to enhance device integration. Further, these four conductive blocks (that is, these four bits) are independent from each other, such that the secondary electron injection is avoided, and device reliability is enhanced.

In the above structure, the floating gate 110 is partitioned into four conductive blocks 110a to 110d as an example. It is appreciated that the floating gate 110 can also be partitioned into more than four conductive blocks (such as six conductive blocks 110a to 110f as shown in FIG. 2). By adjusting the threshold voltages of the channel regions under the conductive blocks of different rows to be different from each other, a six-bit memory structure is formed.

The structure of a multi-bit flash memory is described as above. Hereinafter, the method of fabricating the multi-bit flash memory is introduced. FIGS. 3A to 3F are top views of the flash memory formed in various process stages, and FIGS. 4A to 4F are cross-sectional views along the line B–B" as shown in FIGS. 3A to 3F.

Figure 3A:
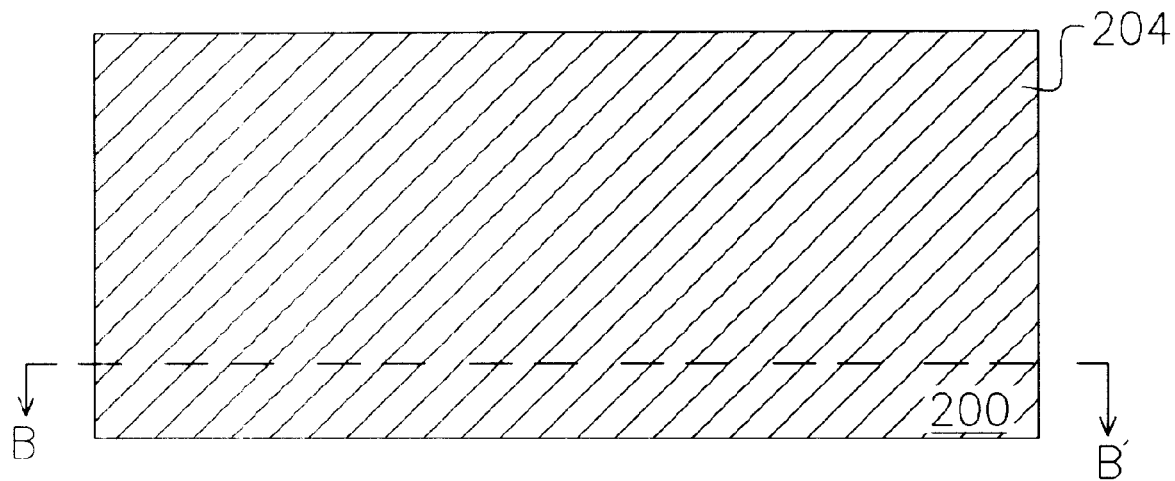
FIGS. 3A to 3F show top views of a flash memory fabricated in various processing stages.
Figure 4A:
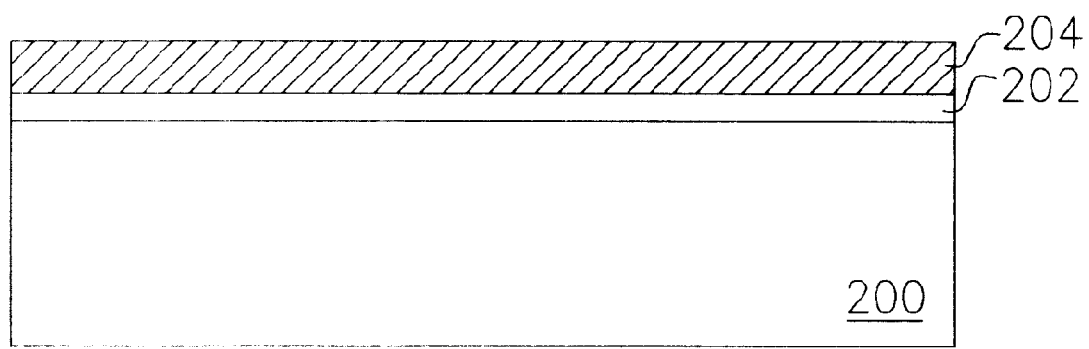
FIGS. 4A to 4F are cross-sectional views along the line B–B' as shown in FIGS. 3A to 3F.

In FIGS. 3A and 4A, a substrate 200 is provided. The substrate 200 includes a silicon substrate, for example. An oxide layer 202 is formed on the substrate 200 as a tunneling oxide layer. The method of forming the oxide layer 202 includes thermal oxidation, for example.

A conductive layer 204 is formed on the oxide layer 202. The material of the conductive layer 204 includes germanium polycide, for example. The method of forming the conductive layer 204 includes chemical vapor deposition with silane, germane and hydrogen as reaction gases.

Figure 3B:
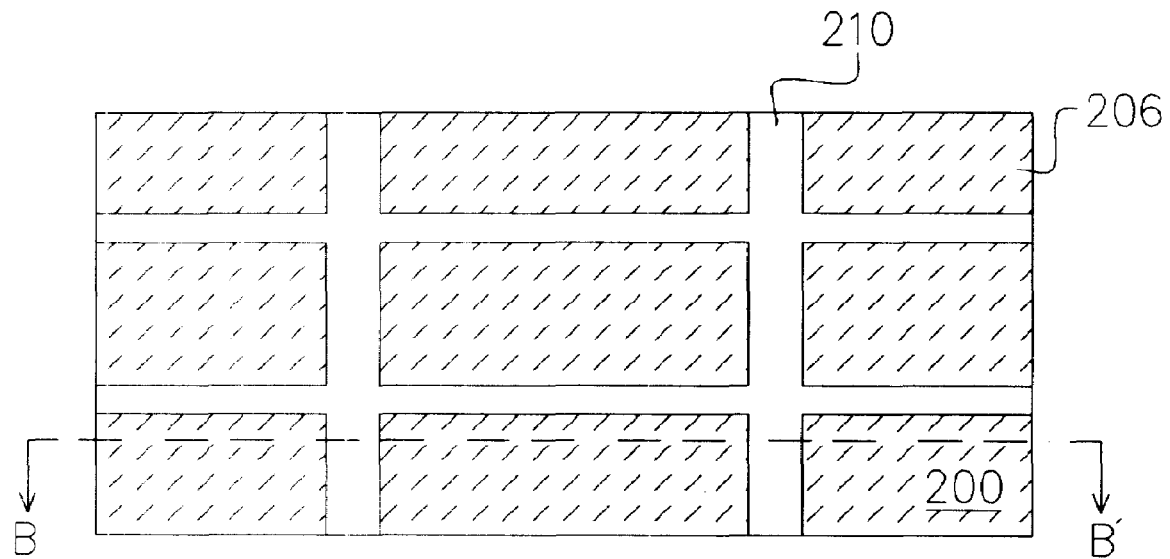
Figure 4B:
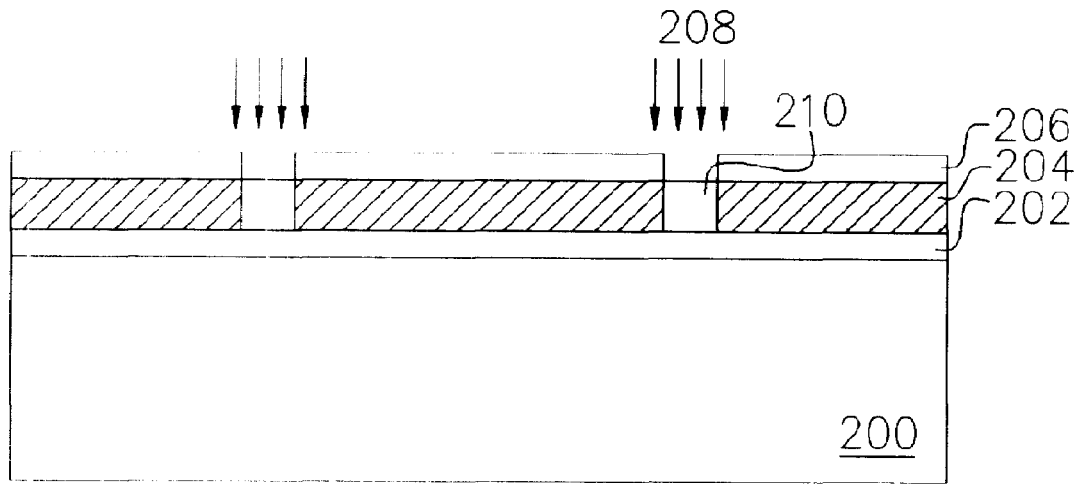

Referring to FIGS. 3B and 4B, a patterned photoresist layer 206 is formed on the conductive layer 204. The patterned photoresist layer 206 exposes a region of the conductive layer 204 predetermined for forming an isolation region.

An ion implantation step 208 is performed using the patterned photoresist layer 206 as a mask. The dopant implanted into the exposed region include oxygen ions. Oxygen ions are implanted into the exposed region to form the oxygen ion doped region 210. The dosage of the oxygen ions is about $1\times10^{18}$ atoms/cm$^2$ to about $2\times10^{18}$ atoms/cm$^2$, and the implantation energy is about 20 KeV to about 80 KeV, for example. In an alternative embodiment, the dopant implanted into the exposed region also includes nitrogen ions or other ions, which can react with silicon to form insulation material.

Figure 3C:
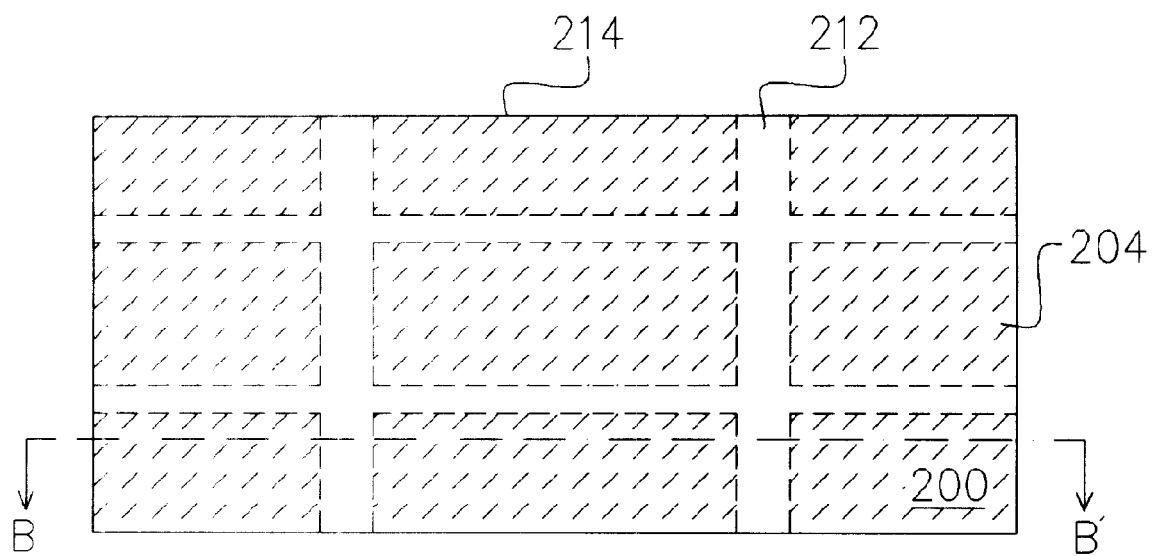
Figure 4C:
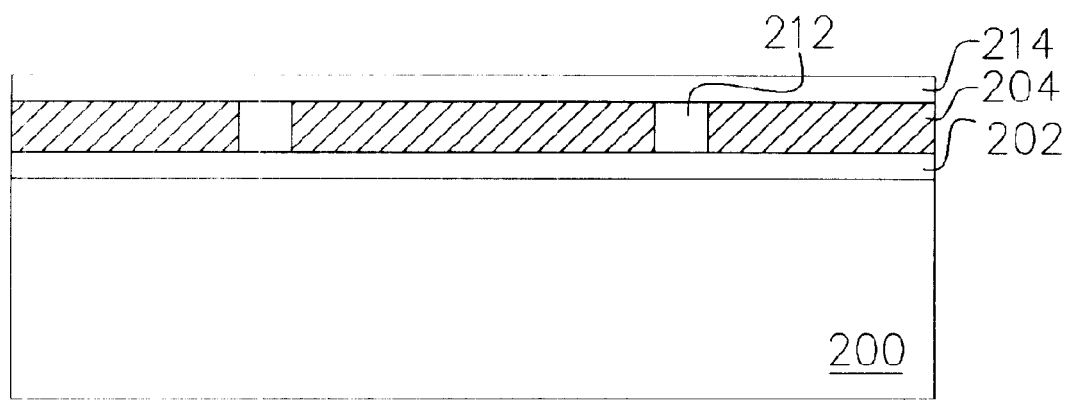

Referring to FIGS. 3C and 4C, the patterned photoresist layer 206 is removed, and an annealing process is performed. The oxygen ions (or nitrogen ion) and the silicon contained in the conductive layer 204 are reacted into silicon oxide (or silicon nitride) to form the isolation region 212. The annealing process is performed at about 950° C. to about 1150° C. The isolation region 212 partitions the conductive layer 204 into a plurality of conductive blocks, for example, the conductive layer 204 of a single memory cell is partitioned into four conductive blocks in this embodiment.

A gate dielectric layer 214 is formed over the substrate 200. The material of the gate dielectric layer 214 includes silicon oxide, silicon oxide/silicon nitride, silicon oxide/silicon nitride/silicon oxide, for example. The thickness of the gate dielectric layer 214 is about 50 angstroms to about 150 angstroms, for example. The method for forming the gate dielectric layer 214 includes chemical vapor deposition, for example.

Figure 3D:
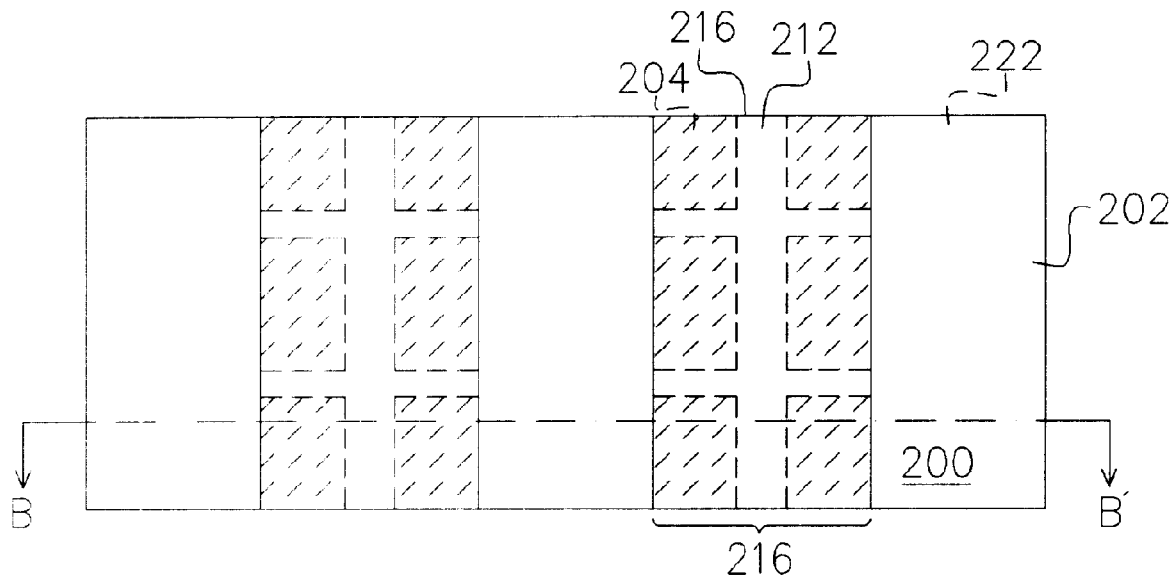
Figure 4D:
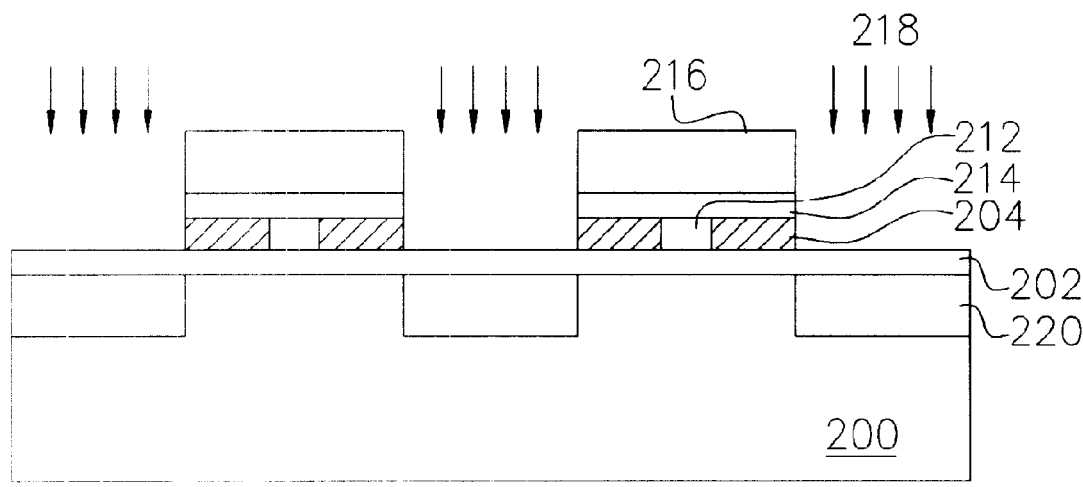

Referring to FIGS. 3D and 4D, a patterned photoresist layer 216 is formed on the gate dielectric layer 214. The patterned photoresist layer 216 exposes a part of the gate dielectric layer 214 under which bit lines are formed subsequently. The exposed part of the gate dielectric layer 214 and the underlying conductive layer 204 are removed to expose the substrate 200 predetermined for forming the bit lines. An ion implantation step 218 is performed using the patterned photoresist layer 216 as a mask to form doped regions 220 (bit lines) in the substrate 200 exposed at two sides of the patterned photoresist layer 216. The implanted ions include arsenic ions with a dosage of about $2\times10^{15}$ atoms/cm$^2$ to about $4\times10^{15}$ atoms/cm$^2$ and an implantation energy of about 50 KeV.

Figure 3E:
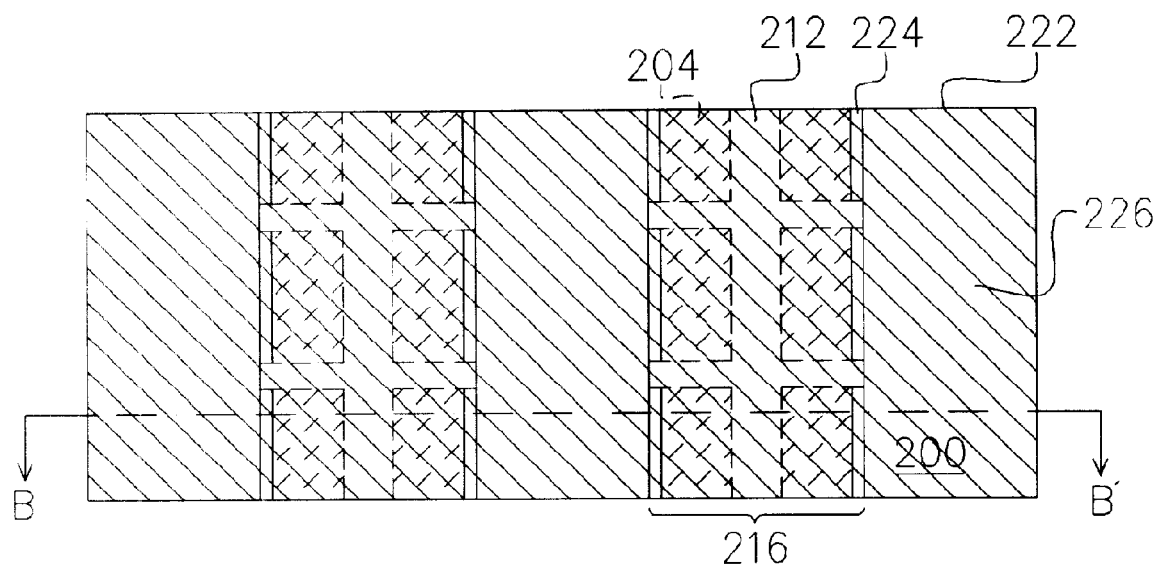
Figure 4E:
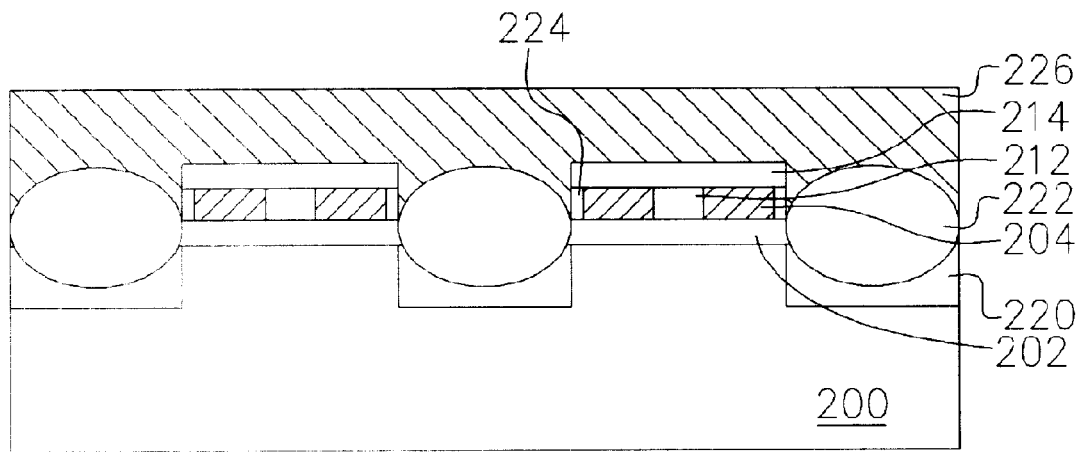

Referring to FIGS. 3E and 4E, the patterned photoresist layer 216 is removed. A thermal process is performed to form a field oxide layer 222 on the doped regions (bit lines) 222 and activate the dopant therein. The field oxide layer 222 is formed to isolate the doped regions 222 and the control gate (word line) formed subsequently. While forming the field oxide layer 222, a spacer 224 may be formed on a sidewall of the conductive layer 204. The spacer 224 provides isolation between the conductive layer 204 and the control gate (word line) formed subsequently.

A conductive layer 226 is formed on the substrate 200. The material of the conductive layer 226 includes doped polysilicon, for example. The method for forming the doped polysilicon includes in-situ implantation and a chemical vapor deposition process, for example.

Figure 3F:
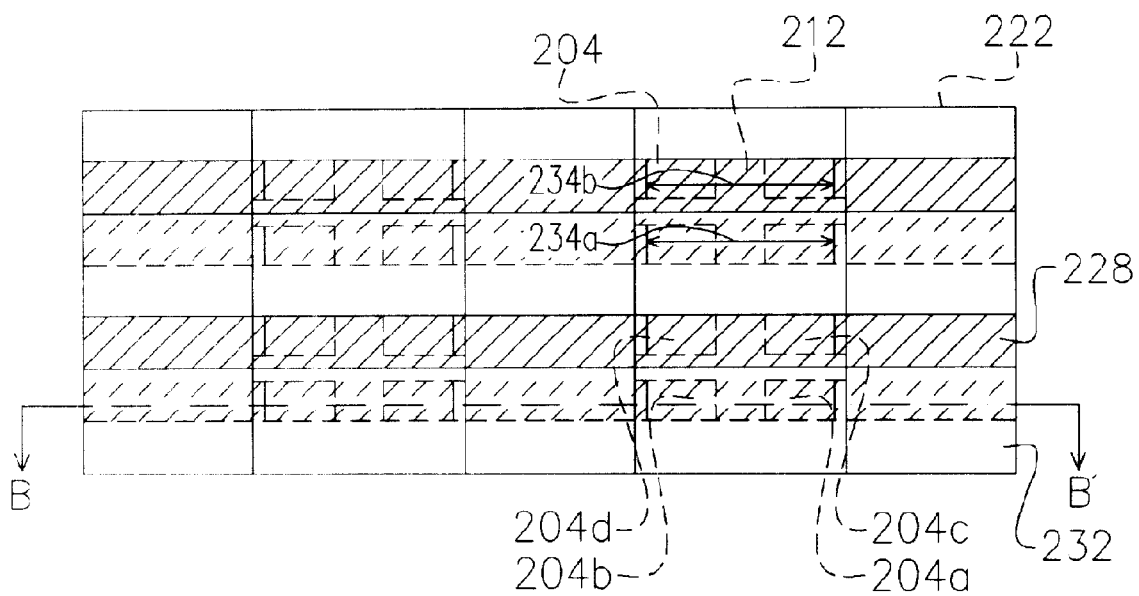
Figure 4F:
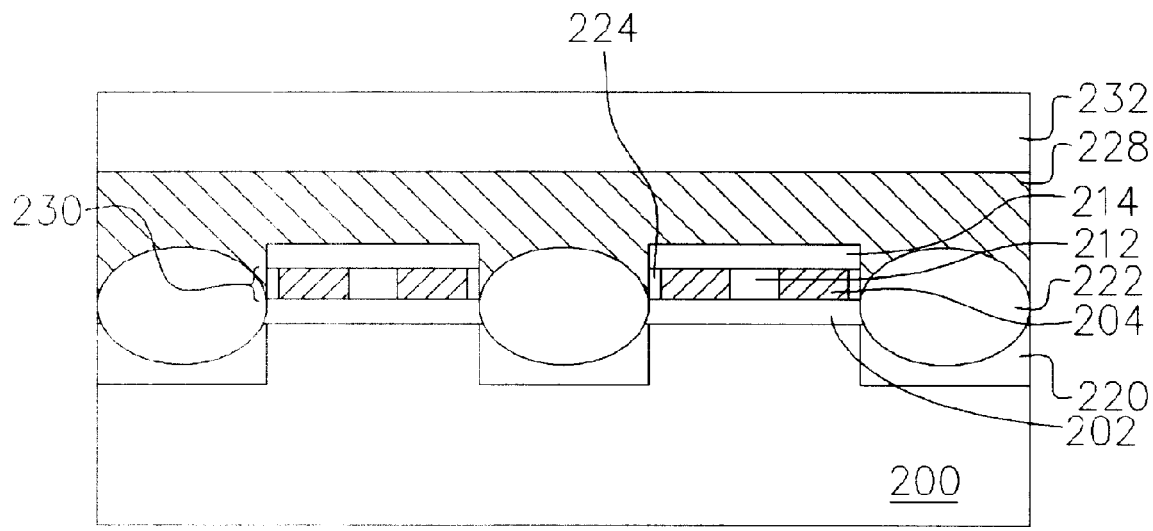

Referring to FIGS. 3F and 4F, a mask (not shown) is used to pattern the conductive layer 226, so as to define the control gate 228 (the word line). While patterning the conductive layer 226, the same mask is used to define the gate dielectric layer 214, the conductive layer 204 and the oxide layer 202 for forming a gate structure, which uses the patterned conductive layer 204 as the floating gate 230. Consequently, the gate structure comprises a stacked structure of the control gate 228, the gate dielectric layer 214, the floating gate 230 and the oxide layer 202. The floating gate 230 of each memory cell comprises four separate conductive blocks 204a, 204b, 204c and 204d arranged in a 2×2 array.

A step of adjusting threshold voltage is then performed. A patterned photoresist layer 232 is formed over the substrate 200 to expose the control gate 228 over the conductive blocks 204c and 204d. Ion implantation is performed using the photoresist layer 232 as a mask to implant dopant into the channel regions 234b under the conductive blocks 204c and 204d, so as to adjust the threshold voltage of the channel regions 234b. Therefore, the threshold voltage of the channel regions 234b under the conductive blocks 204c and 204d is different from that of the channel region 234a under the conductive blocks 204a and 204b. A single memory can thus store four bits of data at once. The subsequent process is known to the person of ordinary skill in the art, and is not further described.

In the above embodiment, oxygen ions are implanted into the conductive layer 204 to partition the conductive layer 204 into a plurality of conductive blocks, so as to form a multi-bit structure. Therefore, without increasing the volume of the memory cells, more bits of data are stored in each memory cell, and the device integration is increased. Further, the conductive blocks are independent and separate from each other, so that the problem of secondary electron injection is resolved.

The dopant implanted into the exposed region not only include oxygen ions, but also include nitrogen ions or other ions which can react with silicon to form insulation material.

In addition, the isolation region 212 may also be formed to partition the conductive layer 204 into another number of conductive blocks instead of four conductive blocks. By adjusting the channel regions under the conductive blocks of different rows with different threshold voltages, various multi-bit structures are obtained.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

The invention claimed is:

1. A method of fabricating a multi-bit flash memory, comprising:
   providing a substrate;
   forming a tunneling oxide layer on the substrate;
   forming a conductive layer on the tunneling oxide layer;
   forming an isolation layer in the conductive layer to partition the conductive layer into more than two conductive blocks arranged in an array with a plurality of rows extending from a region predetermined for forming one bit line to another region predetermined for forming another bit line and a plurality of columns, wherein each row comprises tow conductive blocks, and each column comprises more than two conductive blocks, wherein the step of forming the isolation region further comprises:
   forming a patterned photoresist layer on the conductive layer to expose a part of the conductive layer predetermined for forming the isolation region;
   performing an ion implantation step to implant dopant into the exposed conductive layer; and performing an annealing process to react the dopant with the silicon of the conductive layer to form the isolation region;
   forming a gate dielectric layer on the conductive layer;
   patterning the gate dielectric layer and the conductive layer to form a floating gate comprising a predetermined number of conductive blocks arranged in an array having pluralities of rows and columns, wherein each row comprises a plurality of conductive blocks and each column comprises a plurality of conductive blocks, and wherein the patterned gate dielectric layer is formed vertically above the predetermined number of blocks arranged in the array;
   forming the bit lines in the substrate at two sides of the floating gate;
   forming a control gate on the floating gate so that each multi-bit cell of the multi-bit flash memory comprises said control gate, said patterned gate dielectric layer and said floating gate comprising said plurality of conductive blocks arranged in said array; and
   performing a step of threshold voltage adjustment to result in different threshold voltages of the channel regions under the conductive blocks of different rows.

2. The method according to claim 1, wherein the material of the conductive layer comprises germanium polycide.

3. The method according to claim 1, wherein the dopant includes oxygen ions.

4. The method according to claim 3, wherein ion implantation step is performed with a dosage of dopant of about $1\times10^{18}$ atoms/cm$^2$ to about $2\times10^{18}$ atoms/cm$^2$.

5. The method according to claim 3, wherein the ion implantation step is performed with an implantation energy of about 20 KeV to about 80 KeV.

6. The method according to claim 1, wherein the dopant includes nitrogen ions.

7. The method according to claim 1, wherein the annealing process is performed at about 950° C. to about 1150° C.

8. The method according to claim 1, further comprising a step of forming a field oxide layer after the step of forming the bit lines and before the step of forming the control gate.

9. A method of fabricating a multi-bit flash memory, comprising:

providing a substrate;

forming a tunneling oxide layer on the substrate;

forming a germanium polycide layer on the tunneling oxide layer;

forming a patterned photoresist layer on the germanium polycide layer, the patterned photoresist layer exposing a part of the germanium polycide layer predetermined for forming an isolation region;

performing an ion implantation step to implant dopant into the exposed germanium polycide layer;

performing an annealing process to react the dopant with silicon of the germanium polycide layer to form the isolation region that partitions the germanium polycide into more than two conductive blocks arranged in an array the array having a plurality of rows extending from a region predetermined for forming a bit line to a region predetermined for forming another bit line and a plurality of columns each having said conductive blocks;

forming a gate dielectric layer on the germanium polycide layer;

patterning the gate dielectric layer and the germanium polycide layer to form a floating gate comprising a predetermined number of conductive blocks arranged in an array having pluralities of rows and columns, wherein each row comprises a plurality of conductive blocks and each column comprises a plurality of conductive blocks, and wherein the patterned gate dielectric layer is formed vertically above said predetermined number of blocks arranged in said array;

forming the bit lines in the substrate at two sides of the floating gates;

forming a control gate on the floating gate so that each multi-bit cell of the multi-bit flash memory comprises said control gate, said patterned gate dielectric layer and said floating gate comprising said plurality of conductive blocks arranged in said array; and performing a step of threshold voltage adjustment to result in different threshold voltages of the channel regions under the conductive blocks of different rows.

10. The method according to claim 9, wherein the step of ion implantation further comprises implanting oxygen ions into the exposed germanium polycide layer.

11. The method according to claim 9, wherein the step of ion implantation further comprises implanting nitrogen ions into the exposed germanium polycide layer.

12. The method according to claim 9, further comprising forming a field oxide and a spacer on a sidewall of the floating gate after the step of forming the bit lines and before the step of forming the control gate.

* * * * *